United States Patent [19]
Lee et al.

[11] Patent Number: 5,874,754
[45] Date of Patent: *Feb. 23, 1999

[54] MICROELECTRONIC CELLS WITH BENT GATES AND COMPRESSED MINIMUM SPACINGS, AND METHOD OF PATTERNING INTERCONNECTIONS FOR THE GATES

[75] Inventors: Jasopin Lee, Cupertino; Gobi Padmanabhan, Sunnyvale; Abraham Yee, Cupertino; Stanley Yeh, Fremont, all of Calif.

[73] Assignee: LSI Logic Corporation, Milpitas, Calif.

[*] Notice: The term of this patent shall not extend beyond the expiration date of Pat. No. 5,440,154.

[21] Appl. No.: 415,173

[22] Filed: Mar. 31, 1995

Related U.S. Application Data

[63] Continuation-in-part of Ser. No. 86,217, Jul. 1, 1993, Pat. No. 5,440,154.

[51] Int. Cl.$^6$ .............................. H01L 27/02; H01L 29/78
[52] U.S. Cl. .......................... 257/206; 257/202; 257/208; 257/384; 257/401; 257/413
[58] Field of Search ..................................... 257/202, 204, 257/206, 208, 288, 384, 401, 413, 578, 745

[56] References Cited

U.S. PATENT DOCUMENTS

| | | | |
|---|---|---|---|
| 3,786,319 | 1/1974 | Tomisaburo | 257/401 |
| 3,787,962 | 1/1974 | Yoshida et al. | 257/401 |
| 4,319,396 | 3/1982 | Law et al. | |

(List continued on next page.)

FOREIGN PATENT DOCUMENTS

| | | |
|---|---|---|
| 59-35465 | 2/1984 | Japan . |
| 1-164062 | 6/1989 | Japan . |
| 3-21015 | 1/1991 | Japan . |

OTHER PUBLICATIONS

Neil H.E. Weste, Kamran Eshraghian, *Principles of CMOS VLSI Design, A System Perspective*, (Addison–Wesley Publishing 1985) pp. 58–60, 76–80, 87–89.

R. A. Piro & F. R. Sporck, "Buffered CMOS Masterslice Cell For Logic," IBM Technical Disclosure Bulletin, vol. 27, No. 6, Nov. 1984, pp. 3452–3454.

(List continued on next page.)

Primary Examiner—Gene M. Munson

[57] ABSTRACT

A microelectronic cell includes a semiconductor substrate, an active area formed in the substrate, a gate formed in the active area, and a first contact formed in the active area. The contact has a width D perpendicular to a reference axis defined in the active area, and is spaced from the reference axis by a minimum spacing E. The gate includes a first section which extends substantially parallel to the reference axis, the first contact being disposed between the first section and said reference axis, the first section being spaced from the first contact by a minimum spacing A; a second section which extends substantially parallel to and is spaced from said reference axis by a minimum spacing C<(A+D+E), the second section being spaced from the first section along said reference axis; and a third section which extends at an angle to the reference axis and joins adjacent ends of the first and second sections. The non-rectangular configuration of the cell has compressed minimum spacings to provide a space saving that permits the presence of a greater number of devices on a single chip as compared to conventional gate array chips. One or more patternable busses of conductive material are formed on a gate array structure over field oxide portions thereof during an initial step of patterning the layer of conductive material to expose active areas of differing conductivity type and to form electrodes thereover. After further processing to form other electrode regions in the active areas such as source and drain regions, but prior to formation of an insulation layer over the structure for formation of a metal layer thereon, the busses are subjected to a further patterning step to form custom interconnections between various electrodes in the gate array structure so as to form a desired custom chip.

26 Claims, 10 Drawing Sheets

U.S. PATENT DOCUMENTS

| | | |
|---|---|---|
| 4,345,365 | 8/1982 | Carrigan . |
| 4,561,168 | 12/1985 | Pitzer et al. . |
| 4,677,735 | 7/1987 | Malhi . |
| 4,689,657 | 8/1987 | Percival et al. .......................... 257/208 |
| 4,753,896 | 6/1988 | Matloubian . |
| 4,804,636 | 2/1989 | Groover, III et al. . |
| 4,884,118 | 11/1989 | Hui et al. . |
| 4,965,651 | 10/1990 | Wagner ................................. 257/207 |
| 5,010,032 | 4/1991 | Tang et al. . |
| 5,034,348 | 7/1991 | Hartswick et al. . |
| 5,256,894 | 10/1993 | Shino . |
| 5,358,886 | 10/1994 | Yee et al. . |
| 5,391,904 | 2/1995 | Asami et al. ........................... 257/401 |
| 5,440,154 | 8/1995 | Carmichael et al. ................... 257/206 |

OTHER PUBLICATIONS

R. Gregor, et al., "A One–Million Circuit CMOS ASIC Logic Family," IEEE Custom Integrated Circuits Conference, May 1993, pp. 23.1.1–23.1.4.

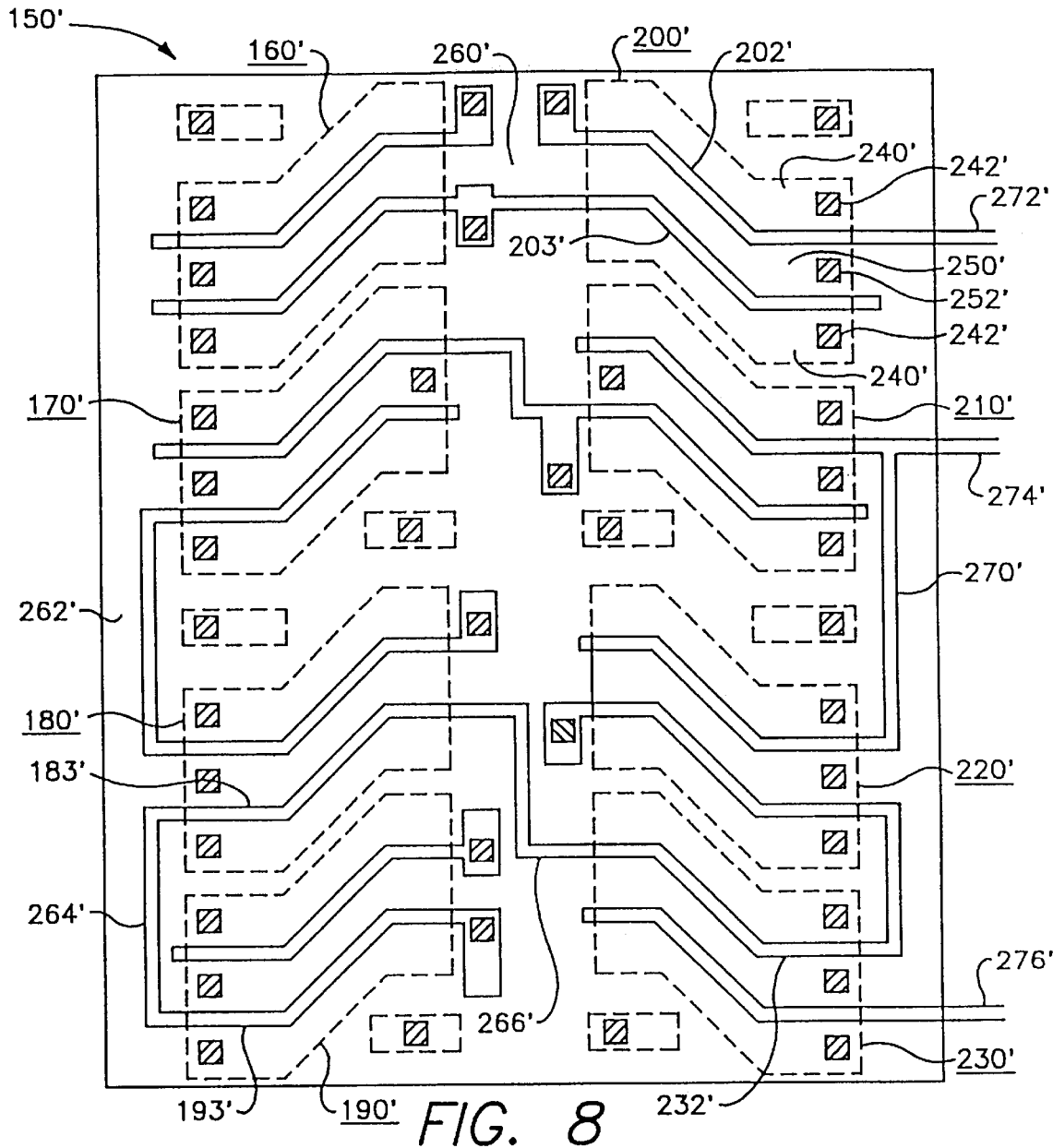
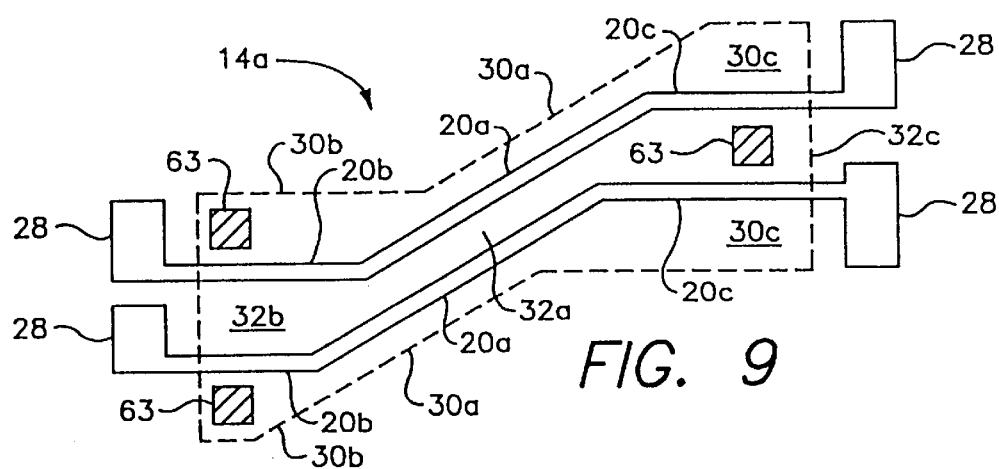

MICROELECTRONIC CELLS WITH BENT GATES AND COMPRESSED MINIMUM SPACINGS, AND METHOD OF PATTERNING INTERCONNECTIONS FOR THE GATES

CROSS-REFERENCE TO RELATED APPLICATION

This application is a continuation-in-part of copending U.S. patent application Ser. No. 08/086,217, filed Jul. 1, 1993, entitled "NON-RECTANGULAR MOS DEVICE CONFIGURATIONS FOR GATE ARRAY TYPE INTEGRATED CIRCUITS", by Tim Carmichael et al, now issued as U.S. Pat. No. 5,440,154 on Aug. 8, 1995, and also related to co-pending patent application Ser. No. 08/578,745, filed on Dec. 26, 1995, entitled "Non-Rectangular MOS Device Configurations for Gate Array Type Integrated Circuits".

BACKGROUND OF THE INVENTION

1. Field of the Invention

The present invention generally relates to the art of microelectronic integrated circuits, and more specifically to microelectronic cells with bent gates and compressed minimum spacings, and a method of patterning interconnections for the gates.

2. Description of the Related Art

Among integrated circuit manufacturers there has developed a practice of forming a partially generic type of integrated circuit device, or chip, that can be subsequently made into a variety of different types of custom chips for various applications. These partially formed generic devices are sometimes referred to as a gate array type chip or a sea of gates.

Typically, a gate array type chip is made up of numerous identical MOS or CMOS circuit elements. A specific custom chip, such as an Application Specific Integrated Circuit (i.e. ASIC), is then developed by electrically connecting the individual MOS or CMOS elements in some appropriate manner through conductive metal layers that are subsequently formed on the gate array chip. The specific patterns of the conductive layers thus determines the custom design aspects of the various integrated circuits, such as ASIC's, that are formed from the gate arrays.

The individual MOS or CMOS elements of a gate array chip are generally uniformly spaced on portions of a surface of the chip. Typically, however, several MOS or CMOS elements in localized regions are functionally grouped together in what are termed cells, and electrically interconnected to form fundamental logic circuit elements, such as AND gates, OR gates and the like. More sophisticated circuit elements are then designed by interconnecting individual cells.

There is a natural desire among integrated circuit manufacturers to maximize the number of functions that can be performed by a single gate array type chip. Thus, the number of individual MOS or CMOS elements on a single gate array chip is normally fairly high, on the order of 600,000 to 1,000,000 individual elements. Typically, however, only half of all of these gates can be used in the subsequently made custom chip.

FIG. 1 shows a small set of identical MOS devices found on a conventional gate array type chip. Conventional production of prior art gate array type circuit structures typically involves the formation in a silicon wafer 2 of P-wells and N-wells to define areas or islands 10a–10d where one or more MOS or CMOS devices will be formed. Areas 10a–10d in FIG. 1 are thus P-islands and/or N-islands. A field oxide (not shown) is then grown on unmasked portions of the silicon wafer 2 to isolate each of the MOS islands 10a–10d from other devices on the wafer 2.

After removal of the field oxide mask, a thin gate oxide layer is grown over portions of the islands 10a–10d, and a polysilicon layer is deposited over the gate oxide layer and other portions of the wafer 2. This polysilicon layer is subsequently patterned to form individual polysilicon strips 20 which form the gates in each of the MOS islands 10a–10d, along with contact pads or "dogbone" areas 28 that extend over the field oxide (not shown) surrounding the MOS islands 10a–10d. Source and drain regions 30 and 32 are then formed in the MOS islands 10a10d by appropriate doping.

A self-aligned silicide layer (not shown), sometimes termed a salicide, may also be formed over the polysilicon strips 20 as well as over the source and drain regions 30 and 32. Another layer of insulation, such as an oxide layer, is then formed over the entire structure and appropriate planarization may be performed.

At this stage in the fabrication of conventional gate array type chips, such as partially shown in FIG. 1, a generic structure has been formed with numerous essentially identical MOS devices such as the devices in MOS islands 10a and 10b disposed beneath the polysilicon strips 20. The particular devices are at this point electrically independent from other MOS devices formed beneath other polysilicon strips in other MOS islands or wells. Alternatively, MOS devices in adjacent islands, such as islands 1c and 10d, may be connected together by continuous polysilicon strips 20'a and 20'b.

The island pairs 10c and 10d are still electrically isolated from other pairs in other islands, however, including the islands 10a and 10b shown in FIG. 1. Depending upon the desired electrical circuitry to the implemented in the partially fabricated gate array type chip, the various electrically isolated devices 10a, 10b and the like are then connected or "wired" together by formation of a metal layer over the previously deposited insulation layer (not shown) and patterning of this metal layer into a wiring harness made up of strips 40.

Where more than one metal layer is to be used, a further insulation layer is deposited over the first metal layer (forming strips 40) before the additional metal layers are deposited and patterned. Thus separate insulation layers, typically oxide layers, separate each of the various metal layers.

Formation of electrical interconnections between the MOS gate electrodes, such as electrodes 20 of devices 10a and 10b also involves the formation of contacts 50 through the insulation layer (not shown) in order to provide a path from the metal strips 40 to the polysilicon pads 28. These contacts 50 are formed by making a hole in the insulating layer and filing this hole with a conductive material that provides an electrical path between the polysilicon contact pad 28 and the patterned metal layer 40. Similarly contacts 55 are also provided at various points to further provide contacts between the various source/drain regions 30 & 32 of each island 10a–10d and other metal strips residing in the same metal layer as the metal strips 40.

Additionally, to appropriately bias the gate array substrate, various electrical connections must be normally made to miniature N and P wells or substrate taps 62 located on the substrate of the chip 2. These connections are typically provided by further metal strips (not shown) residing in the same patterned metal layer as the metal strips 40. Contacts 65 are made with the N and P substrate taps 62 by forming additional apertures through the intervening insulating layer between the patterned metal layer and the substrate, and again filling these apertures with a conductive material.

Due to the complexity of wiring necessary to develop various desired electronic circuit elements on a gate array type chip, it is often necessary to provide two and often even three patterned metal layers on a single array type chip in order to achieve all of the desired electrical interconnections and cross-over wirings between various active devices, such as those illustrated in FIG. 1.

Since each contact opening or via formed between the polysilicon contact pads 28 and the overlying metal layer can result in electrical failure due to any one of misalignment, underetching, overetching, or improper filling of the via openings with conductive material, an increase in the number of via openings and patterned metal wiring layers of a gate array chip can have a negative impact on the overall yield of chips or dies developed from a semiconductor wafer.

Additionally, the limited availability of space for necessary electrical interconnections, even among several metal layers, has been found to limit the total number of individual MOS or CMOS devices that can actually be employed on a single semiconductor chip. Accordingly, in some applications less than half of the individual MOS devices placed on a single gate array type chip may be actually used in the final custom designed chip due to the demands of cross-over wiring and cell interconnection.

It would be desirable if at least some of the electrical interconnections between various active devices on a substrate, such as the MOS devices in islands 10a–10d, bipolar and other types of active devices, could be carried out in a manner which would reduce the number of contacts needed between the gates or other conductive material portions of the individual devices and the various metal layers.

It would similarly be desirable to eliminate the need for at least one of the numerous metal wiring layers typically needed to form a complete wiring harness for the gate array chips, while still permitting the initial formation of a partially generic gate array type structure that is capable of being subsequently electrically connected together to form a variety of different electrical circuits.

Integrated circuit manufacturers also continue to expend considerable resources attempting to implement complex logic circuitry on smaller areas of the semiconductor substrate of the gate array chips and to increase the density and functionality of the MOS devices populating the substrate. While it would be desirable to reduce the size of each of the individual MOS devices, it has also been determined that process limitations and detrimental parasitic effects in the MOS devices themselves limit the degree to which, for example, the length of the gate elements of the individual MOS devices can be reduced.

Accordingly, the number of MOS type devices that can be effectively used in gate array type chips depends on a number of limiting factors, including the size of the individual MOS devices, the number of interconnections between the MOS devices forming a local functional cell, and the number of interconnections between various cells making up the gate array chip.

Nonetheless, there still exists in the circuit manufacturing community a keenly felt need to continue increasing the number of individual MOS devices that may be formed on a gate array chip and effectively utilized when the partially generic gate array chip is processed to form a custom design. The present invention fulfills this need.

SUMMARY OF THE INVENTION

Broadly, and in general terms, one aspect of the present invention provides an effective reduction in the area of individual MOS devices forming a gate array type chip by employing a non-rectangular configuration for these individual MOS devices. Another aspect of the present invention provides for the use of fewer connections in or through a separate metal layer to provide electrical interconnection between individual MOS devices in a single functional cell. In some custom circuit designs this aspect of the invention may provide for the complete elimination of one the of several metal layers that would otherwise be required for interconnection of MOS devices in the same functional cell.

When combined with the non-rectangular geometry of the individual MOS devices within a cell, the reduced number of interconnections within the cell through a separate metal layer provides a substantially enhanced number of paths for connections between various other cells in the gate array chip. This increase in the number of routing paths in turn enhances the total number of individual MOS devices that can be successfully used when a custom chip is made from a gate array chip employing MOS devices configured in accordance with the present invention.

In accordance with one aspect of the present invention, the individual MOS devices in a gate array chip respectively include a non-rectangularly configured source and drain, or other first and second regions of a conductivity type differing from the gate array substrate, along with a channel between the two regions and a non-rectangular gate structure disposed above the channel.

Depending on the particular manufacturing process employed to construct the novel non-rectangular "bent gate" MOS devices of the present invention, a twenty to forty percent or higher reduction in the size of the functional cells that are made up of these MOS devices can be realized over functional cells that are made up of conventional linearly shaped MOS devices, such as illustrated in FIG. 1.

Another aspect of the present invention involves a specific configuration for each of the non-rectangular regions forming the MOS devices of the gate array chip. A microelectronic cell in accordance with one aspect of the invention includes a semiconductor substrate, an active area formed in the substrate, a gate formed in the active area, and a first contact formed in the active area.

The contact has a width D perpendicular to a reference axis defined in the active area, and is spaced from the reference axis by a minimum spacing E. The gate includes a first section which extends substantially parallel to the reference axis, the first contact being disposed between the first section and said reference axis, the first section being spaced from the first contact by a minimum spacing A; a second section which extends substantially parallel to and is spaced from said reference axis by a minimum spacing C<(A+D+E), the second section being spaced from the first section along said reference axis; and a third section which extends at an angle to the reference axis and joins adjacent ends of the first and second sections.

The non-rectangular configuration of the cell has compressed minimum spacings to provide a space saving that permits the presence of a greater number of devices on a single chip as compared to conventional gate array chips.

Another aspect of the present invention concerns the formation of one or more busses that are made from conductive material interconnecting conductive electrodes, such as for example, gate electrodes in the individual MOS devices of a gate array type chip. These busses are preferably formed on the gate array structure over field oxide portions of the structure during the initial step of patterning the conductive polysilicon material of the gate array to expose P islands and/or N islands and to form conductive gates thereover.

After further processing to form other electrode regions such as for example the source and drain regions in MOS islands, but prior to formation of an insulation layer over the structure for formation of a first metal layer thereon, the busses of conductive material are subjected to a further patterning step so as to form desired custom interconnections between various gates in the MOS devices that were previously all connected to the busses.

By forming these busses of conductive material during the initial step of patterning the conductive material to form a generic structure, and then providing a second patterning step, wherein custom interconnections are formed in the layer of conductive material, that is wherein the busses are formed, some of the custom interconnections that were formerly provided by the first level of metal wiring layer can be eliminated.

The novel features of the present invention will be better understood from the following detailed description, considered in connection with the accompanying drawings, wherein like numbers designate like elements. It should be expressly understood, however, that the drawings are for purposes of illustration and description only and are not intended as a definition of the limits of the present invention.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 8 is a fragmentary top view of a gate array cell made of non-rectangular MOS devices in a portion of a gate array type chip made in accordance with the present invention;

FIG. 9 is a fragmentary top view of a single MOS structure having a non-rectangular configuration in accordance with the present invention;

DETAILED DESCRIPTION OF THE INVENTION

Figure 2:
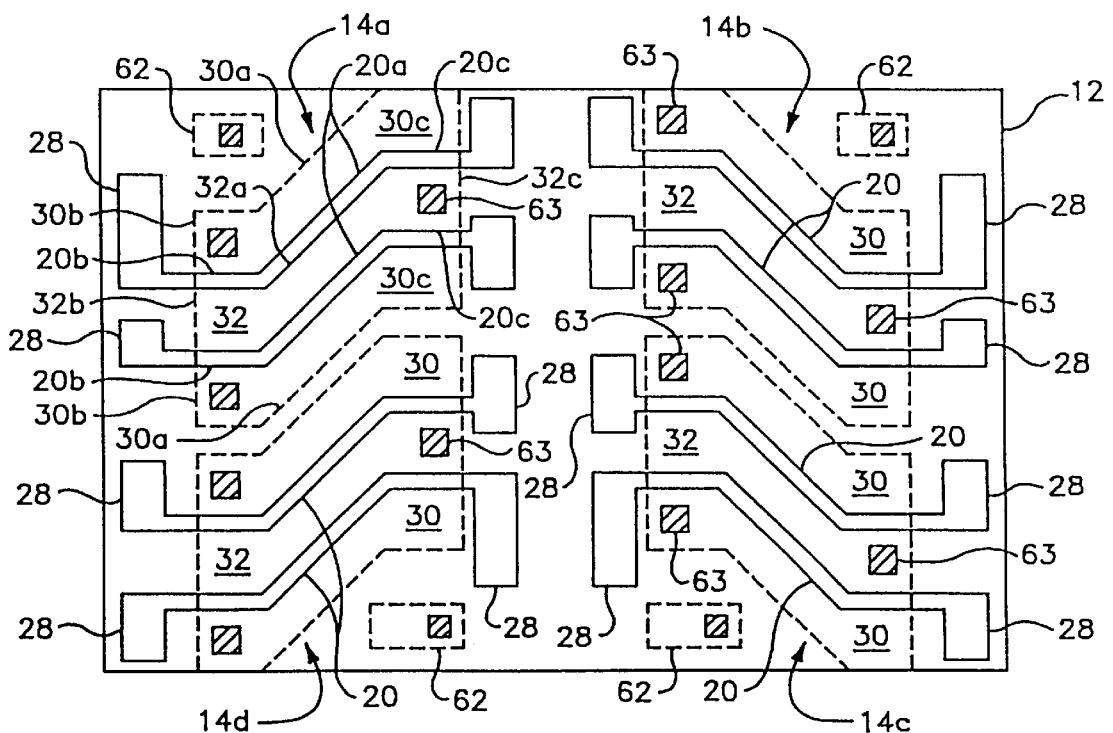
FIG. 2 is a fragmentary top view of several non-rectangular MOS devices on a portion of a gate array type chip in accordance with one aspect of the present invention.

Referring to the figures, and more particularly FIG. 2, there is shown on a gate array substrate 12 several MOS devices 14a–14d having non-rectangular configurations in accordance with one aspect of the present invention. In one embodiment, each of the MOS devices 14a–14d includes source and drain regions 30 and 32 separated by channels over which gates 20 are formed.

The source and drain regions 30 and 32, as well as the gate regions 20, may be thought of as forming middle portions 30a, 32a and 20a as well as opposing end portions 30b, 30c, 32b, 32c and 20b, 20c. For clarity of illustration, these various portions of the source and gate regions 30 and 32 and the gates 20 are labelled in FIG. 2 only with respect to the MOS device 14a.

As shown in FIG. 2, the end portions 30b, 30c and 32b, 32c of the respective source and drain and the end portions 20b, 20c of the gate regions 20 are respectively displaced from the middle portions 30a and 32a of the source and drain and the middle portion 20a of the gate 20. Considering, for example, the middle portions 20a of the gates 20 in each of the MOS devices 14a–14d, these gate middle portions 20a may be thought of as having longitudinal axes oriented along the length of the middle portions 20a.

As can be seen in FIG. 2, however, the end portions 20b and 20c of the gates 20 are "bent" or oriented at a non-parallel angle to this longitudinal axis. The source and drain regions 30 and 32 can be seen to similarly conform to the bent or non-rectangular configuration of the gates 20. The novel non-rectangular configuration of the MOS devices 14a–14d can be further understood by considering each of the end portions 20b and 20c of the gates 20 as having their own respective longitudinal axes oriented along their respective lengths.

These respective longitudinal axes of the gate end portions 20b and 20c can be seen to form an acute angle with respect to the longitudinal axis of the gate middle portion at 20a. In one preferred embodiment, this acute angle is selected as 45 degrees. It should be understood, however, that alternative acute angles could be selected without departing from the spirit of the present invention.

Figure 1:
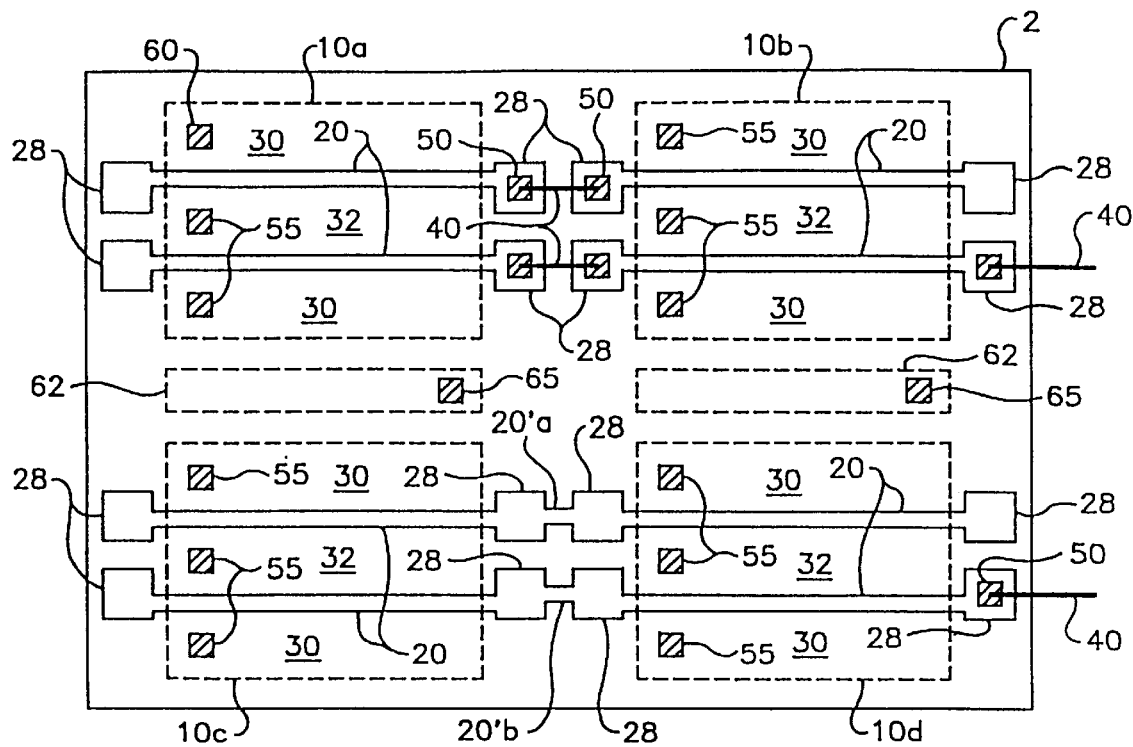
FIG. 1 is a fragmentary top view of several prior art MOS devices on a portion of a conventional gate array type chip.

It can be seen that the non-rectangular configuration of the MOS devices 14a–14d provides the devices with a reduced area as compared to conventional rectangularly configured gate array MOS devices such as devices 10a–10d illustrated in FIG. 1 even if the length of the gate regions 20 is the same in both the conventional MOS devices 10a–10d illustrated in FIG. 1 and the novel bent gate type MOS devices illustrated in FIG. 2.

Thus, the bent gate type MOS devices of the present invention can be provided with reduced surface areas even if process limitations or parasitic effects preclude the use of smaller gate lengths than the gate lengths employed in connection with conventional rectangularly configured MOS devices.

One important advantage of the novel bent gate type MOS devices 14a–14d concerns the switching speed of the devices. This switching speed is increased in one embodiment of the present invention by varying the dimensions of middle portions of the source and drain regions in the novel bent gate MOS devices 14a–14d. Referring to FIG. 9 there is shown an expanded view of a single MOS device 14a of the present invention having a pair of regions 30a,b,c which may either be source or drain regions and another region 32a,b,c of differing conductivity type disposed between the two regions 30a,b,c. The region 32a,b,c may also be a source or drain region, but complimentary to the regions 30a,b,c.

Thus, if regions 30a,b,c are source regions, then the complimentary regions 32a,b,c would be a drain region. The MOS device 14a further includes a pair of gates 20a,b,c disposed at the interface between either of the source/drain regions 32a,b,c and the complimentary region 32a,b,c. As illustrated in FIG. 9, each of the source/drain regions may be viewed as divided into middle regions such as middle regions 30a and 32a along with opposing end regions 30b,32b and 30c,32c. As mentioned above in this embodiment of the present invention, the middle portions 30a and 32a of the source/drain regions are narrower than the respective opposing end portions 30b,30c and 32b,32c.

This variation in the dimensions of the source/drain regions 30 and 32 is understood to reduce parasitic capacitance between the two regions and the substrate 2. As a result, the switching speeds of the bent gate MOS devices 14a–14d are dramatically increased. This increase in switching speed translates into functional cells that perform predetermined logic functions at a dramatically increased rate. Accordingly, gate array structures or other logic devices constructed from MOS devices employing the novel bent gate configuration of the present invention can significantly outperform similar structures made up of conventional rectangularly configured MOS devices.

Another advantage of the non-rectangular configuration of the gate array MOS devices 14a–14d illustrated in FIG. 2 concerns the placement of the substrate taps 62. The substrate taps 62 are preferably disposed in line with electrical contact regions 63 of either one of the source/drain regions 30 and 32 in the MOS devices 14a–14d. This placement of the substrate taps 62 provides for connection of the taps 62 with straight inline power busses (not shown) that are the same busses used to supply power to either of the source/drain regions 30 and 32 of the MOS devices 14a–14d.

Another aspect of the present invention concerns the formation of conductive material, or busses, in a gate array in order to consecutively interconnect a plurality of conductive electrodes employed as gates among various MOS devices in a gate array type chip. The busses are preferably formed on the structure over field oxide portions thereon during the initial step of patterning the conductive gates thereover. After further processing to form other electrode regions such as, for example, the source and drain regions in MOS islands, but prior to formation of an insulation layer over the structure for formation of a metal layer thereon, the busses of conductive material are subjected to a further patterning step to form custom interconnections between various MOS device gates in the integrated circuit structure that were previously all connected to the busses.

By use of the term "conductive material" is meant an electrically conductive material such as a conductive polysilicon, a germanium-silicon material, or a silicide such as a refractory metal silicide, e.g., titanium silicide. By way of illustration, and not of limitation, the conductive material used to form the structure of the invention will hereinafter be referred to as polysilicon, it being understood that other conductive material may be used in place of or in addition to the polysilicon when desired or needed.

It should be noted that while the invention will hereinafter be described with respect to the interconnection of gate electrodes of MOS devices, by way of illustration and not of limitation, the invention is equally applicable to other forms of gate array type chips such as arrays of bipolar devices, that is with emitters interconnected; or combinations of MOS/bipolar devices; or any other types of partially generic active devices that can be subsequently processed to form "custom" type chips.

Figure 3:
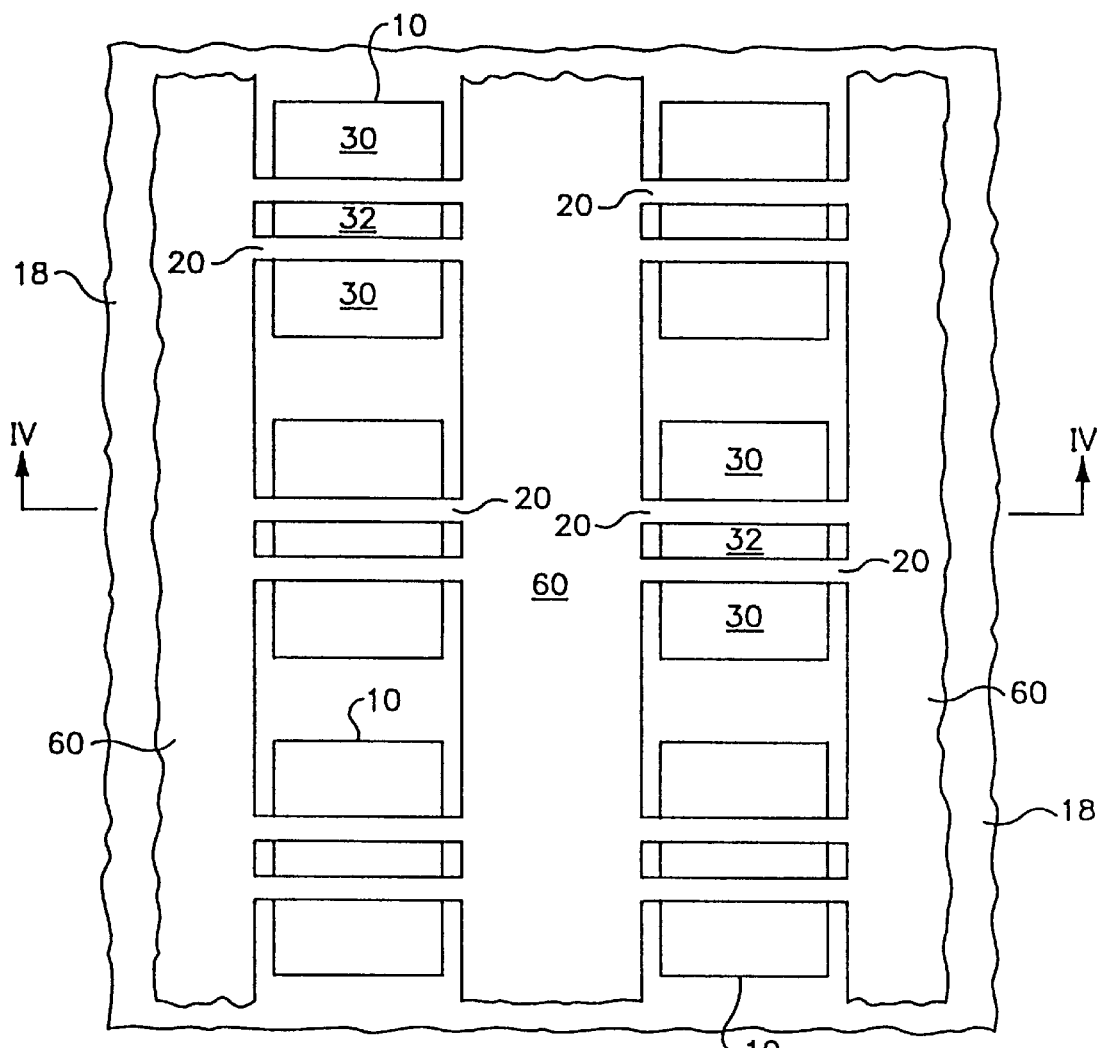
FIG. 3 is a fragmentary top view of another aspect of the present invention illustrating busses of conductive material formed over an oxide field between individual MOS devices.
Figure 4:
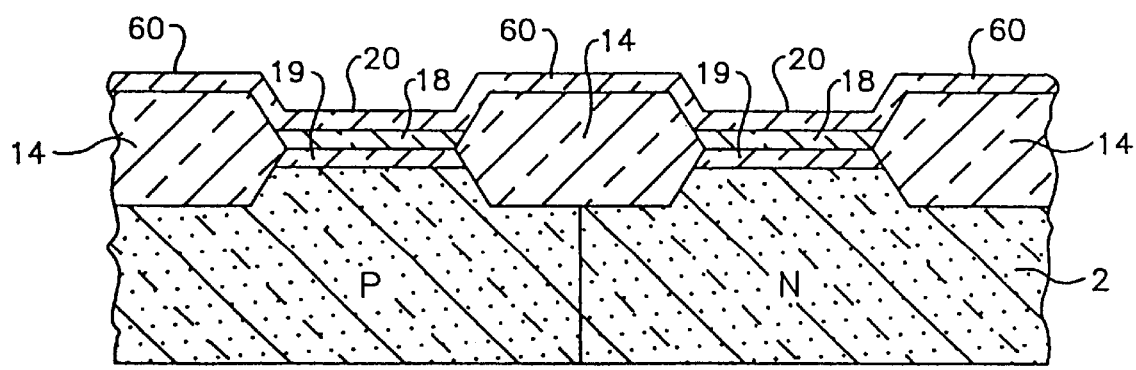
FIG. 4 is a fragmentary side section view of the structure of FIG. 3, taken along the lines IV—IV to show the continuous bus of conductive material formed between the conductive strips over adjacent MOS islands.

Referring now to FIGS. 3 and 4, a gate array type chip incorporating this aspect of the invention is illustrated comprising bus structures 60 of conductive material formed over field oxide 14 on a semiconductor wafer 2 and interconnecting gate electrode strips 20 over MOS islands or active areas 10 in which source regions 30 and drain regions 32 are formed. As shown in FIGS. 3 and 4, polysilicon bus structure 60 is initially connected to all of the polysilicon gate electrode strips 20 formed over all of the MOS islands 10. The polysilicon bus structure 60 and the polysilicon strips 20 are formed by patterning a single layer of polysilicon.

This polysilicon layer is formed on wafer 2 after wafer 2 has been masked to permit growth of field oxide 14 which surrounds each MOS island 10, followed by removal of the mask and formation of a gate oxide layer over the portions of wafer 2 exposed by removal of the field oxide mask. It should be noted that polysilicon bus 60 is simply being illustrated and described as being formed over a field oxide 14 which is grown on unmasked portions of a masked silicon wafer. However, the polysilicon bus structure of the invention could also be constructed over other isolation structures such as, for example, grooves or trenches formed in wafer 2 and then filled with insulation material to electrically isolate each MOS island from adjacent MOS islands.

As is known to those skilled in the art, devices of the same type within each island may be isolated from one another by gates that are inactive or turned off, commonly referred to as "gate isolation," which are also initially connected to the busses. After the polysilicon layer has been patterned to form polysilicon bus 60 and polysilicon gate electrode strips 20, the exposed portions of the MOS islands are then doped to form source and drain regions 30 and 32.

The MOS islands may reside in N-wells or P-wells and, therefore, may be appropriately doped to form source and drain regions for either PMOS or NMOS transistors, it being understood that the polysilicon bus structure of the invention is equally applicable to either type of integrated circuit structure, or combinations of adjacent PMOS and NMOS devices to form CMOS structures interconnected together by the polysilicon bus or busses of the invention.

After formation of source/drain regions 30 and 32 in MOS islands 10, a silicide layer (not shown) may be formed over the initially patterned polysilicon by depositing a layer of metal such as, for example, titanium capable of reacting with silicon to form the corresponding metal silicide, e.g., titanium silicide, sometimes referred to as "salicide" or self-aligned silicide. Alternatively the silicide layer may be formed after the subsequent patterning of polysilicon busses 60 to form the custom interconnections or wiring, that is, the generic gate array structure may be stored or inventoried for future use prior to formation of the metal silicide layer thereon.

When the silicide layer is formed prior to storage, the unreacted metal, i.e., metal not over silicon, may be selectively removed after the silicide step. Alternatively, wafer 2, containing the generic MOS devices formed thereon, may be stored in this condition, with the unreacted metal subsequently removed when the remainder of the wafer processing, i.e., the customizing of the wafer is to be performed.

In some instances, it may be desired to deposit a CVD nitride or oxide layer over the structure, either before or after forming the silicide layer, as a protective layer which would then be etched off prior to the subsequent custom patterning of the gate array.

Figure 5:
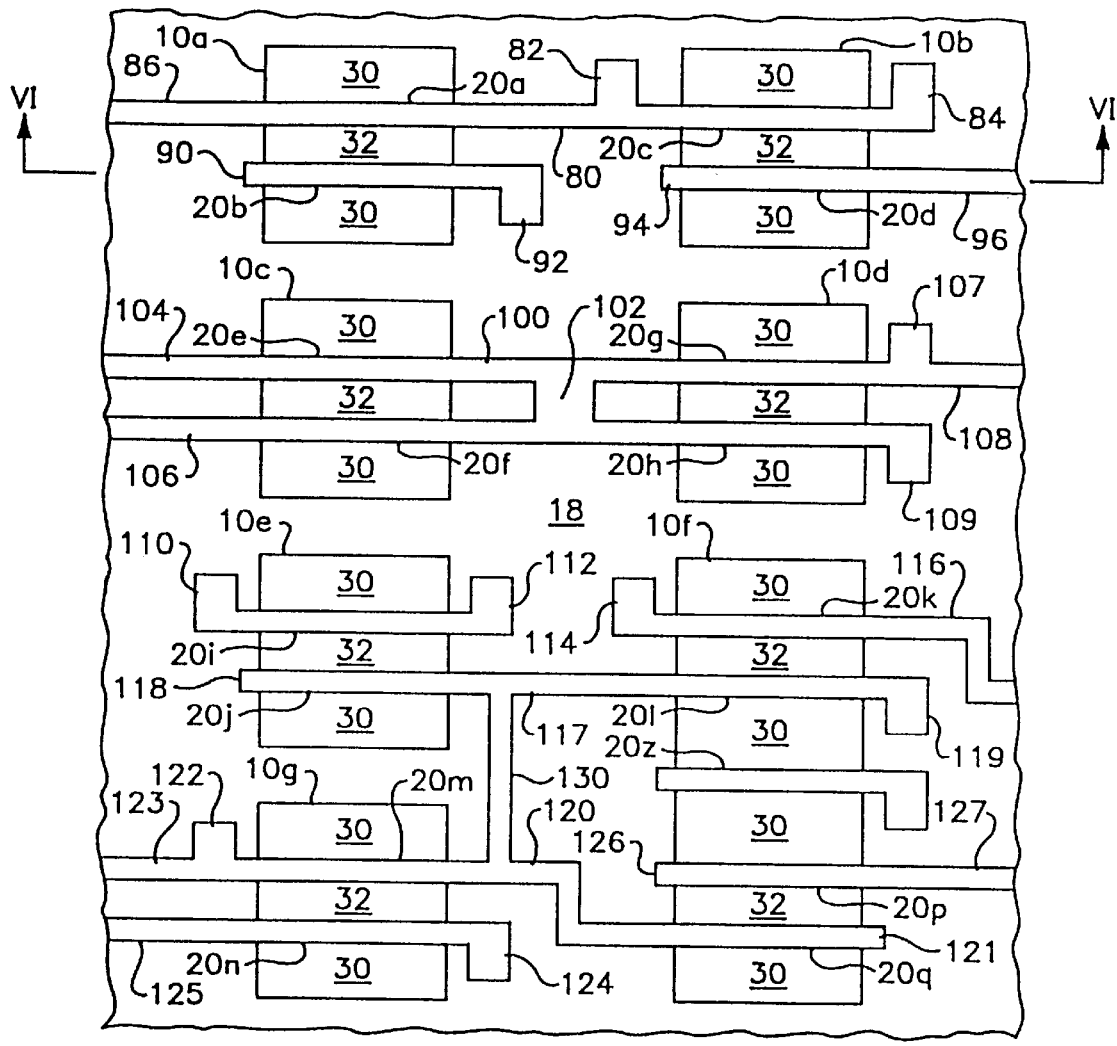
FIG. 5 is a fragmentary top view illustrating a typical patterning configuration after a bus on conductive material of the present invention has been patterned to implement a particular electrical circuit.
Figure 6:
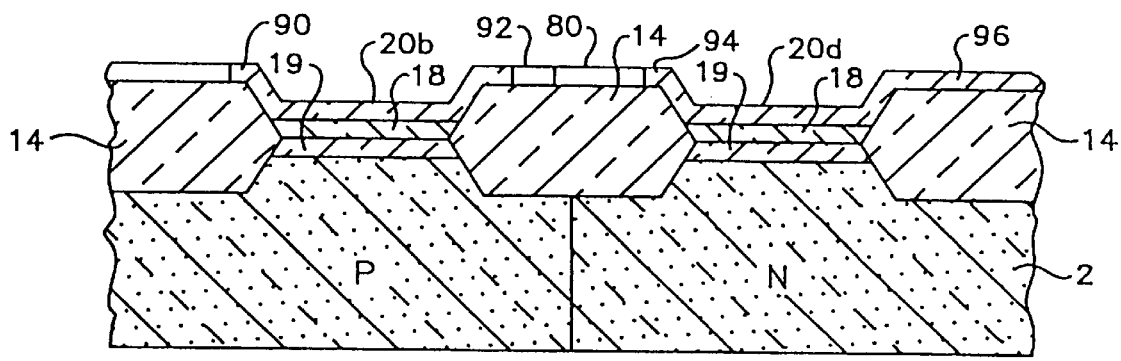
FIG. 6 is a fragmentary side section view of a portion of the structure of FIG. 5 taken along lines VI—VI.

Turning now to FIGS. 5 and 6, the use and advantages of the polysilicon bus during subsequent customized processing of the integrated circuit structure will now be described. It will be understood, however, that the patterned structure illustrated in FIGS. 5 and 6 is only for purposes of illustrating the various patterns which can be formed to show the flexibility permitted by the invention. As best seen in FIG. 5, polysilicon bus 60 has now been masked and etched, i.e., patterned, to form a number of interconnect structures to at least partially implement, at the polysilicon level, the desired connection of the individual MOS devices together to form the desired electrical circuit or structure, e.g., such as a NAND gate or a NOR gate, etc.

In FIG. 5, polysilicon gate electrode strip 20a, in MOS island 10a, is shown as connected by polysilicon strip 80 to polysilicon gate electrode strip 20c in MOS island 10b, i.e., those MOS transistors respectively formed in MOS islands 10a and 10b using polysilicon gate electrode strips 20a and 20c are now electrically connected together.

A polysilicon contact pad 82 is shown formed between MOS islands 10a and 10b and connected to polysilicon strip 80, while a second contact pad 84 is shown on the right electrically connected to polysilicon strip 20c. Polysilicon contact pads 82 and 84 permit vertical interconnections to be made to a metal layer to, for example, permit the just described MOS transistors formed in MOS islands 10a and 10b to be connected to other areas of the integrated circuit structure through such an overlying metal layer.

Polysilicon strip 86, also connected to polysilicon gate electrode strip 20a, serves to interconnect the just described MOS transistors in MOS islands 10a and 10b with other devices to the left of the portion of the integrated circuit structure illustrated in FIG. 5. Still referring to MOS island 10a and 10b, it will be noted that polysilicon gate electrode strip 20b is not connected to polysilicon gate electrode strip 20d. Rather polysilicon gate electrode strip 20b is provided with a simple termination 90 on one end and a contact pad 92 at the opposite end.

Polysilicon gate electrode strip 20d is also provided with a simple termination 94 at one end and a continuation portion 96, at its opposite end, to connect the MOS transistor (s), formed using polysilicon strip 20d at their gate electrode, to other devices on the integrated circuit structure. It will be noted that the patterned portions of polysilicon bus 60 (in FIG. 3) which are respectively connected to polysilicon gate electrode strips 20b and 20d (FIG. 5) are also shown in the side section view of FIG. 6, with portions of polysilicon strip 90 also visible.

Continuing to MOS islands 10c and 10d, it will be noted that polysilicon gate electrode strips 20e, 20f, 20g, and 20h have all been connected together by polysilicon portion 100 which includes a contact pad 102 to permit vertical connection to a metal layer as well for further electrical connection to other portions of the integrated circuit structure. Strips 20e, 20f, and 20g are shown, respectively, as continuing at 104, 106, and 108, while strips 20g and 20h are respectively shown connected to contact pads 107 and 109.

In MOS island 10e, polysilicon gate electrode strip 20i is shown formed with a contact pad 110 at one end and another contact pad 112 at its opposite end, representing the traditional prior art "dogbone" construction for all of the polysilicon electrode strips. Polysilicon gate electrode strip 20k over MOS island 10f is shown formed with contact pad 114 at one end and a fragmentary portion 116 of a connection on its opposite end to another device or structure which is not directly aligned with it, as will be discussed below with respect to the interconnection between strips 20m and 20q. Polysilicon gate electrode strips 20j and 20l, formed respectively over MOS islands 10e and 10f, are shown as connected together by polysilicon strip 117, with strip 20j terminating, at its opposite end, at 118, and strip 20l terminating, at its opposite end, in a contact pad 119.

Polysilicon gate electrode strip 20m, formed over MOS island 10g, is connected to polysilicon gate electrode strip 20q over MOS island 10f by a dog-leg shaped polysilicon strip 120. Strip 120 is also shown connected to strip 117 by a cross strip 130. Polysilicon gate electrode strip 20m, at its opposite end, is connected to contact pad 122 and extension 123, while Polysilicon gate electrode strip 20q, at its opposite end, is terminated at 121.

Polysilicon gate electrode strip 20n over Mos island 10g is provided with an extension 125 at one end and a contact pad 124 at its opposite end. Polysilicon gate electrode strip 20p is provided with a termination 126 at one end and a contact pad 127 at its opposite end. Mos island 10f is further shown with a gate isolation formed using strip 20z which separates gate strip 20l from gate strip 20p.

Thus, in comparing the various configurations shown in FIG. 5 (and FIG. 6), and comparing these with the repeating "dogbone" configuration of the prior art shown in FIG. 1, it can be seen that the initial provision of polysilicon bus members 60, in accordance with the invention and as depicted in FIGS. 3 and 4, permits the initial formation of a generic gate array integrated circuit structure with the same degree of flexibility as in the prior art "dogbone" generic gate array structure. However, unlike the prior art "dogbone" structure of FIGS. 1 and 2. The generic gate array structure of the invention, provided with one or more polysilicon bus structures 60, permits a large amount of the subsequent custom wiring of the gate array (to provide specific circuitry) to be carried out at the polysilicon level, i.e., without using overlying metal layers.

Such subsequent use of the same polysilicon layer used to form the gate electrodes to also provide some of the interconnects has a number of advantages, including first of all, a reduction in the number of contact openings between the polysilicon contact pads and overlying metal layers. Such a reduction of contact openings should increase the yield since failures may occur due to misregistry of the contact openings, under etching, over etching, and improper filling of the contact opening with conductive material.

Furthermore, providing some of the interconnects at the polysilicon level reduces the amount of metal wiring needed which can, in turn, reduce the complexity of the metal wiring, as well as, in some cases, even reduce the number of metal wiring levels needed.

Figure 7:
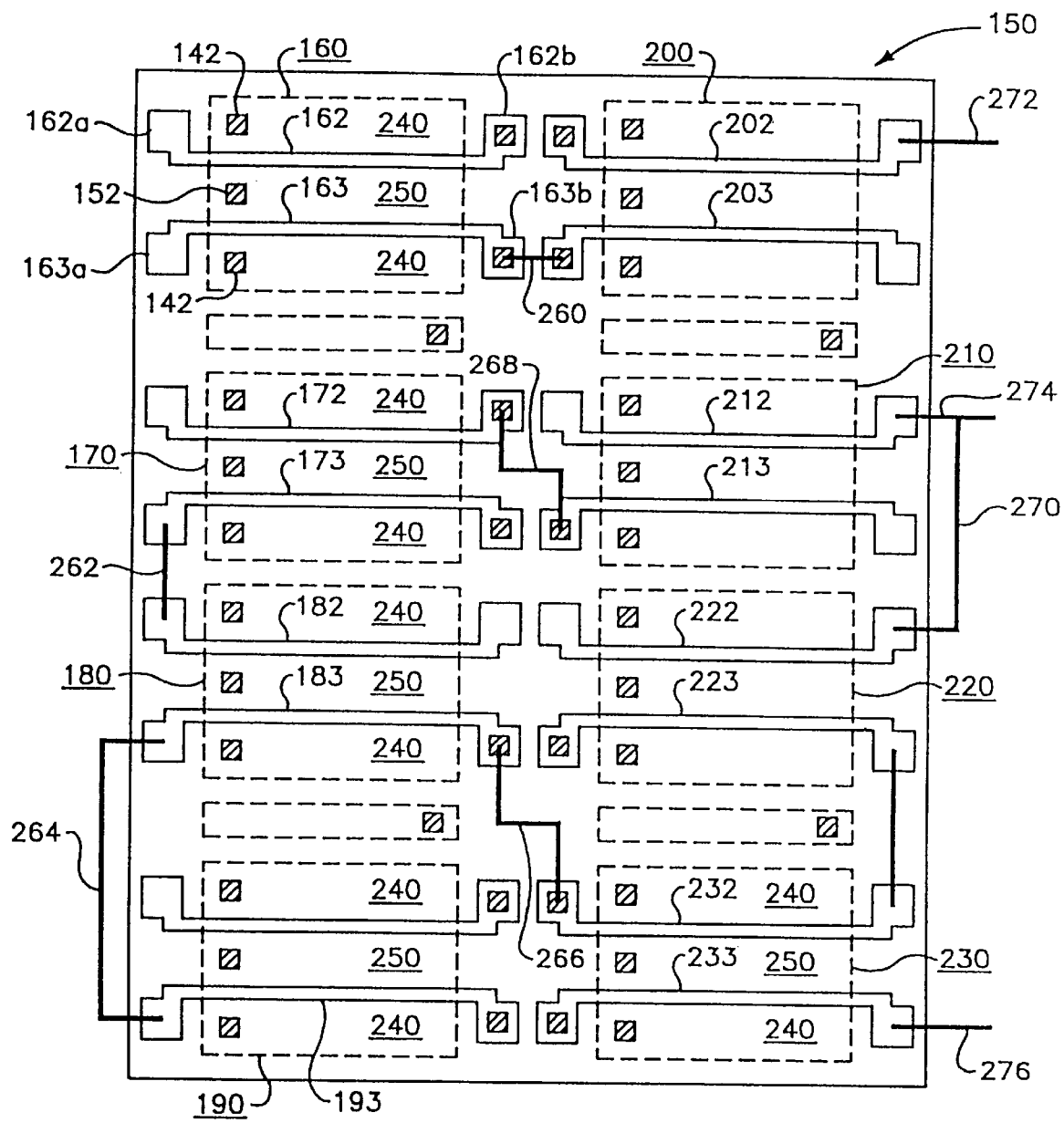
FIG. 7 is a fragmentary top view of a prior art cell of MOS devices in a portion of a conventional gate array type chip.

The depictions provided in FIGS. 7 and 8 dramatically illustrate the significant space and metal layer routing advantages provided by combining both aspects of the present invention in a single gate array type chip. FIG. 7 illustrates a hypothetical functional cell 150 of a prior art gate array chip while FIG. 8 illustrates the same functional cell 150' configured in accordance with the present invention.

A comparison of FIGS. 7 and 8 illustrates the reduced surface area of the novel cell 150' resulting from implementation of both the bent gate configuration of the MOS devices residing within the cell 150' along with the use of polysilicon busses to interconnect selective MOS devices within cell 150' so as to achieve the intended logic function of the particular cell illustrated.

Returning to the conventional gate array 150 illustrated in FIG. 7, the cell 150 includes eight essentially identical prior art MOS devices 160, 170, 180, 190, 200, 210, 220, 230 each having a conventional rectangular design. Each of these MOS devices further includes source and drain regions 240 and 250 which respectively include contact surfaces 242 and 252 for communication with an overlaying metal layer (not shown).

Preferably each of the individual MOS devices further includes a pair of gates. For example MOS device 150 includes a pair of gates 162 and 163 separating the source and drain regions 240 and 250. The gates 162 and 163 each terminate in opposing contact pads 162a, 162b and 163a, 163b, respectively.

To accomplish the intended logic functions of the cell 150, the gates of several of the MOS devices within the cell 150 are connected together. As discussed above in the Background of the Invention, however, the interconnection of gates for the MOS devices of the conventional cell 150 are provided by metal straps formed in a pattern metal layer overlaying the cell 150.

Thus, for example, gate 163 of MOS device 160 is connected to gate 203 of the adjacent MOS device 200 by metal strap 260. Similarly gate 173 of MOS device 170 is connected to gate 182 of MOS device 180 by strap 262. Likewise, gate 183 of MOS device 180 is connected to gate 193 of MOS device 190 by strap 264. Gate 183 of MOS device 180 is also connected to gate 232 of MOS device 230 by metal strap 266.

Similarly gate 172 of MOS device 170 is connected to gate 213 of MOS device 210 by metal strap 268. The gate 212 of MOS device 210 is also connected to the gate 222 of MOS device 220 by metal strap 270. As is sometime the case in functional cells of a gate array chip, several of the gates within cell 150 are connected to other metal straps communicating with other elements outside of cell 150.

For example, gate 202 of MOS device 200 is connected by strap 272 to another element outside of cell 150. Similarly gate 212 of MOS device 210 and gate 222 of MOS device 220 are connected by metal strap 274 to elements exterior to cell 150. Gate 233 of MOS device 230 is similarly connected to elements outside the cell 150 by metal strap 276. In all, eight metal straps are used along with fourteen vias or electrical connections through an insulating layer disposed between the substrate of the cell 150 and the metal straps are used to interconnect the desired MOS devices and their respective gates.

Turning to the novel cell structure 150' illustrated in FIG. 8 and made in accordance with the present invention, each of the MOS devices illustrated in the conventional cell 150 illustrated in FIG. 7 is present in the novel cell 150' of FIG. 8, although configured in accordance with one aspect of the present invention so as to have a non-rectangular shape. Primed numbers are employed in FIG. 8 to designate corresponding elements illustrated in FIG. 7.

Thus, for example, MOS device 200' in cell 150' includes source and drain regions 240' and 250, respectively, along with gates 202' and 203'. The source and drain regions 240' and 250 of MOS device 2001 are also provided with contact regions 242' and 252'.

In accordance with another aspect of the present invention, all of the metal straps and fourteen vias with the first metal layer that are used in a conventional cell such as cell 150 are eliminated in the novel cell 150'. The various gates of the MOS devices, such as, devices 180' and 230' are instead connected using polysilicon strips, as discussed more fully above.

Thus, for example, gate 183' of MOS device 180' is connected to gate 193' of MOS device 190' by a polysilicon strip 264' without the need of any metal strap in an overlaying metal layer and without the need of vias electrically communicating with this metal strap. Similarly, gate 183' of MOS device 180' is also connected to gate 232' of MOS device 230' by polysilicon strip 266' without the need to resort to a separate metal layer strap, or vias, therewith.

Use of polysilicon pads within the cell 150' in accordance with the present invention can thus be seen to substantially enhance the availability of routing paths over the cell 150' for other purposes associated with a custom chip that is to be made from a gate array type chip comprising cells similar to cell 150. This substantially enhanced availability of routing paths in turn greatly increases the number of MOS devices on a gate array type chip that can be actively used in forming a custom chip.

In accordance with another aspect of the present invention, a microelectronic cell is provided with compressed minimum spacings between component elements thereof to provide a smaller spaced unit cell and the ability to fabricate a larger number of cells on a semiconductor chip or die.

Microelectronic cells are fabricated according to "design rules" which include minimum spacings. The following minimum spacings will be defined as being relevant to the present invention, together with exemplary values.

Figure 10:
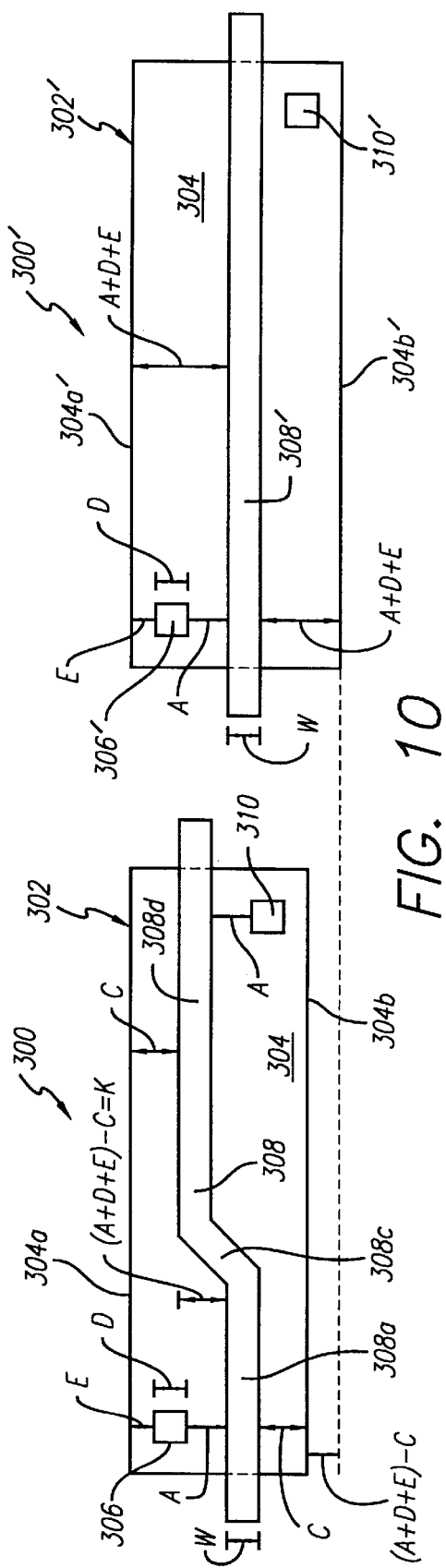
FIG. 10 is a diagram illustrating a microelectronic cell in the form of an inverter or driver element having a bent gate and compressed minimum spacing in accordance with the present invention.

A—contact to gate=0.6 microns
B—gate to gate=0.8 microns
C—gate edge to edge of active diffusion area=1.0 microns
D—contact width=0.7 microns
E—contact edge to edge of active diffusion area=0.6 microns
W—gate length=0.5 microns A microelectronic cell according to the present invention which is configured to function logically as an inverter or driver element is illustrated in FIG. 10 and designated as 300. The cell 300 is formed on a semiconductor substrate 302 in an N- or P-doped active area 304, and comprises a first contact 306 which is spaced from an upper edge 304a of the active area 304 by the distance E. The contact 306 has a square shape with a width (length of one side) equal to D. The upper edge 304a defines a reference axis from which spacings are defined in accordance with the invention.

The cell 300 further comprises a gate 308 formed of polysilicon or other electrically conductive material over an insulating oxide layer (not shown). The gate 308 has a conventional MOS configuration such as described above, and includes a first section 308a which extends parallel to the edge 304a and is spaced from the contact 306 by the distance A such that the contact 306 is disposed between the first section 308a and the edge 304.

The gate 308 further includes a second section 308b which is spaced along the edge 304a from the first section 308a, and a third section 308c which joins the adjacent ends of the sections 308a and 308b. The second section 308b is spaced from the edge 304a by the distance C, such that C<(A+D+E). The third section 308c extends at an angle to the edge 304a, preferably within the range of 30° to 60°, with the most preferred value being 45°.

The cell 300 further includes a second contact 310 which is spaced from the second section 308b by the distance A such that the second section 308b is disposed between the second contact 310 and the edge 304a.

The arrangement of the cell 300 enables the minimum spacing perpendicular to the edge 304a to be reduced over an arrangement including a straight gate. As illustrated in FIG. 10, a cell 300' is shown in comparison with the cell 300, with like elements designated by the same reference numerals primed. The cell 300' is similar to the cell 300, but has a straight gate 380' as contrasted to the bent gate 308 of the cell 300.

The distance from the upper edge of the first section 308a of the gate 308 to the edge 304a is (A+D+E), the same as the distance from the upper edge of the gate 380' to the edge 304a'. However, due to the offset of the section 308b from the section 308a toward the edge 304a, the height of the cell 300 between the upper edge 304a and a lower edge 304b of the active area 304 is reduced from that of the cell 300'.

More specifically, the required minimum spacing from the upper edge of the second section 308b to the edge 304a is C. This is smaller than the spacing (A+D+E) in the case of the cell 300'. Similarly, the distance from the lower edge of the first section 308a of the gate 308 is C, which is smaller than the spacing (A+D+E) between the lower edge of the gate 380' and the edge 304b'.

The reduction in the height of the cell 300 over that of the cell 300' will be demonstrated using the exemplary values set forth above.

The height of the cell 300 is (A+D+E)+W+C=(0.6+0.7+0.6)+0.5+1.0=3.4 microns. The height of the cell 300' is 2(A+D+E)+W=2(0.6+0.7+0.6)+0.5=4.3 microns. Thus, the height of the cell 300 is reduced by 0.9 microns over that of the cell 300', a reduction of approximately 21%.

The optimal distance K by which the second section 308b is offset from the first section 308 toward the edge 304a to provide the maximum reduction in height is K=(A+D+E)−C, which in the present example is 1.9−1.0=0.9 microns. This is the same value by which the height of the cell is reduced.

Figure 11A:
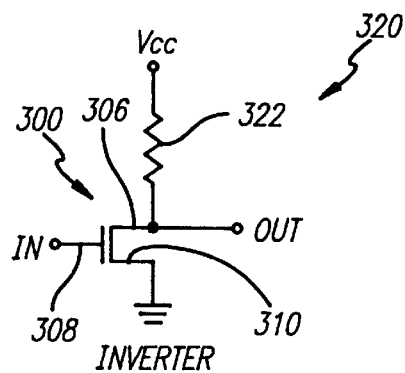
FIGS. 11a and 11b are electrical schematic diagrams illustrating the element of FIG. 10 connected to perform different logical functions.
Figure 11B:
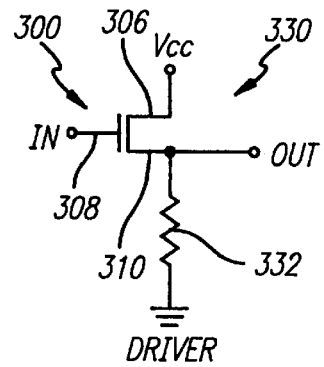

As illustrated in FIGS. 11a and 11b, the cell 300 can be connected to logically function as an inverter or a noninverting driver or buffer. These figures illustrate the cell 300 configured as an NMOS device, although the concept of the invention is equally applicable to PMOS and CMOS.

FIG. 11a illustrates the connection as an inverter 320, in which the contact 306 is connected to a positive potential Vcc through a pull-up resistor 322, the contact 310 is connected to ground (or a potential which is more negative than the potential Vcc), and an input signal IN is applied to the gate 308. An output signal OUT appears at the contact 306.

A positive input signal IN turns on the cell 300, which pulls the output to ground, thereby producing a low output signal OUT. A low input signal IN turns off the cell 300, in which case the output OUT is pulled high by the resistor 322.

FIG. 11b illustrates the cell 300 connected as a noninverting driver or buffer 330. In this case, the contact 306 is connected to Vcc, and a pull-down resistor 332 is connected between the terminal 310 and ground. A high input signal IN turns on the cell 300 which pulls the output OUT to Vcc to produce a high output OUT. A low input signal IN turns off the cell 300, in which case the output OUT is pulled to ground by the resistor 332.

Figure 12:
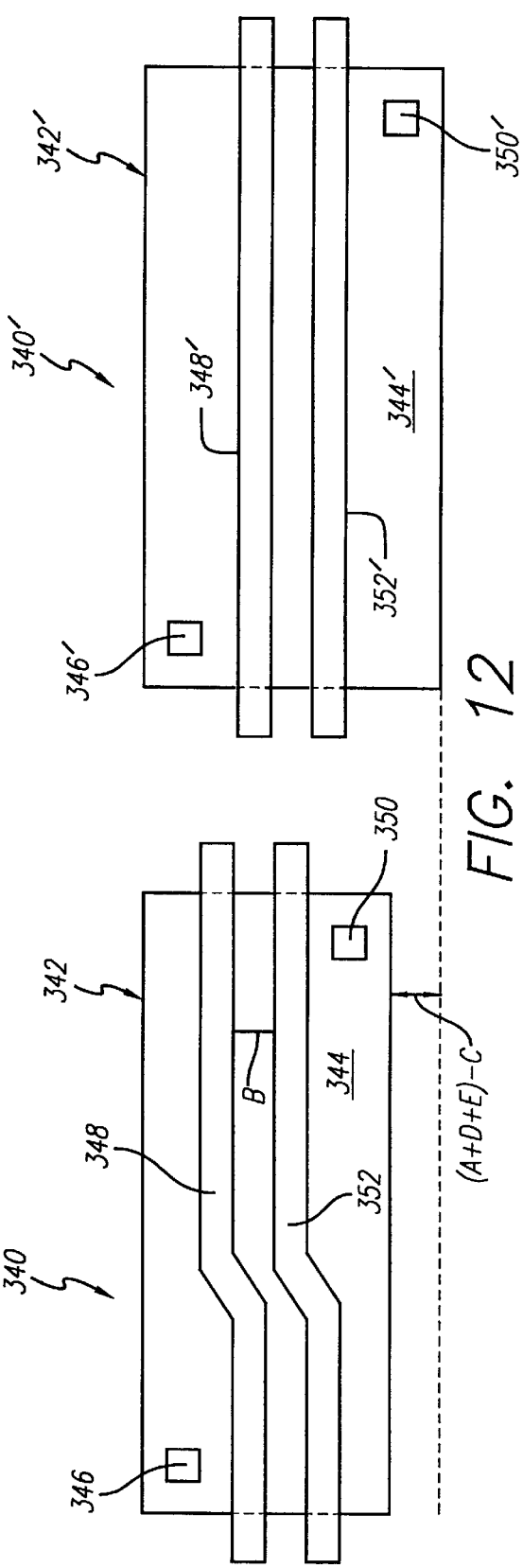
FIG. 12 is a diagram illustrating a microelectronic cell in the form of an ALL element in accordance with the present invention.

FIG. 12 illustrates a microelectronic cell 340 of the present invention configured as an "ALL" element. The cell 340 is formed on a substrate 342 in an active area 344, and includes a contact 346, gate 348 and contact 350 which are essentially similar to the elements 306, 308 and 310 of the gate 300. The cell 340 further comprises an additional gate 352 which is essentially similar to the gate 348, and is disposed between the gate 348 and the terminal 350. The gate 352 is offset from the gate 348 by the distance B.

The cell 340 is referred to as an ALL element because current flow between the contacts 346 and 350 is controlled by both gates 348 and 352. Positive potentials must be applied to ALL (both) of the gates 348 and 352 to enhance the underlying channel and create a conductive path between the contacts 346 and 350.

For comparison, a cell 340' including straight gates 348' and 352' is shown in FIG. 12. The height of the cell 340 is (A+D+E)+B+2W+C, whereas the height of the cell 340' is [2(A+D+E+W)]+B. The reduction of height of the cell 340 over that of the cell 340' is equal to the offset of the second sections of the gates 348 and 352 relative to the first sections thereof, or (A+D+E)−C, the same as the case of the cell 300.

Figure 13A:
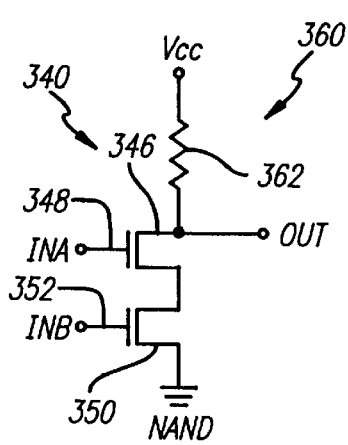
FIGS. 13a to 13d are electrical schematic diagrams illustrating the element of FIG. 10 connected to perform different logical functions.

FIG. 13a illustrates the cell 340 connected to function as a NAND gate 360. The contact 346 is connected through a pull-up resistor 362 to Vcc, whereas the contact 350 is connected to ground. Input signals INA and INB are applied to the gates 348 and 352, whereas an output signal OUT appears at the contact 346.

If positive inputs signals INA and INB are applied to the gates 348 and 352, a conductive path is established between the contacts 346 and 350, and the output OUT is pulled low. If either or both of the input signals INA and INB is low, the portion of the channel under the respective gate 348 and/or 352 will not be enhanced, no conductive path will be established between the contacts 346 and 350, and the output OUT will be pulled to Vcc by the resistor 362.

Figure 13B:
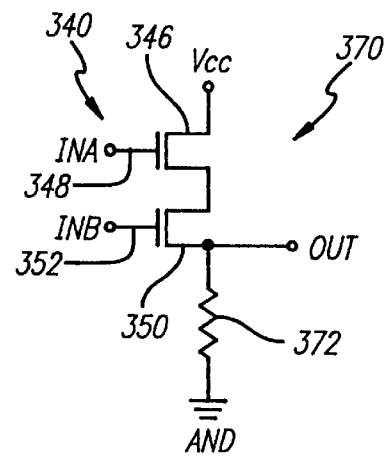

FIG. 13b illustrates the cell 340 connected to function as an AND gate 370, with the contact 346 connected to Vcc, and the contact 350 connected to ground through a pull-down resistor 372.

With positive input signals INA and INB applied to the gates 348 and 352, a conductive path is established between the contacts 346 and 350, and the output OUT is pulled to Vcc. If either or both input signals INA or INB is low, no conductive path is established and the output OUT is pulled to ground by the resistor 372.

Figure 13C:
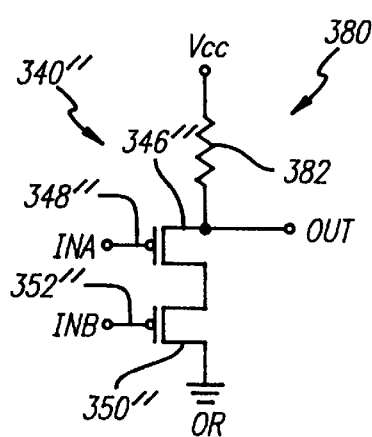
Figure 13D:
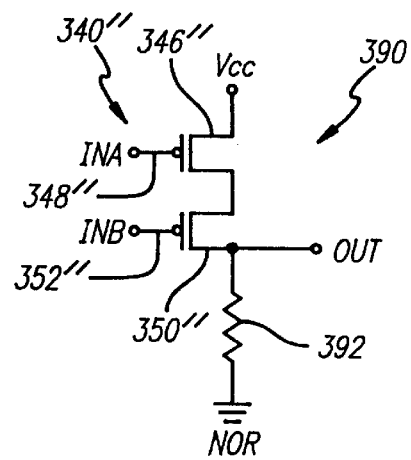

Whereas the NAND gate 360 and AND gate 370 are implemented using NMOS logic, an OR gate 380 and a NOR gate 390 can be implemented using PMOS logic as illustrated in FIGS. 13c and 13d respectively. The transformation is well known in the art using DeMorgan's theorems.

The elements of a cell 340" are designated by reference numerals double primed to distinguish their implementation in PMOS rather than NMOS in FIGS. 13c and 13d. In the OR gate 380, any high input will turn off the cell 340" such that the output is pulled high by a pull-up resistor 382. If both inputs INA and INB are low, the cell 340" is turned on and pulls the output OUT low.

In the NOR gate 390 of FIG. 13d, if any input is high, the output is pulled low by the resistor 392. If both inputs are low, the cell 340" is turned on and pulls up the output OUT.

Figure 14:
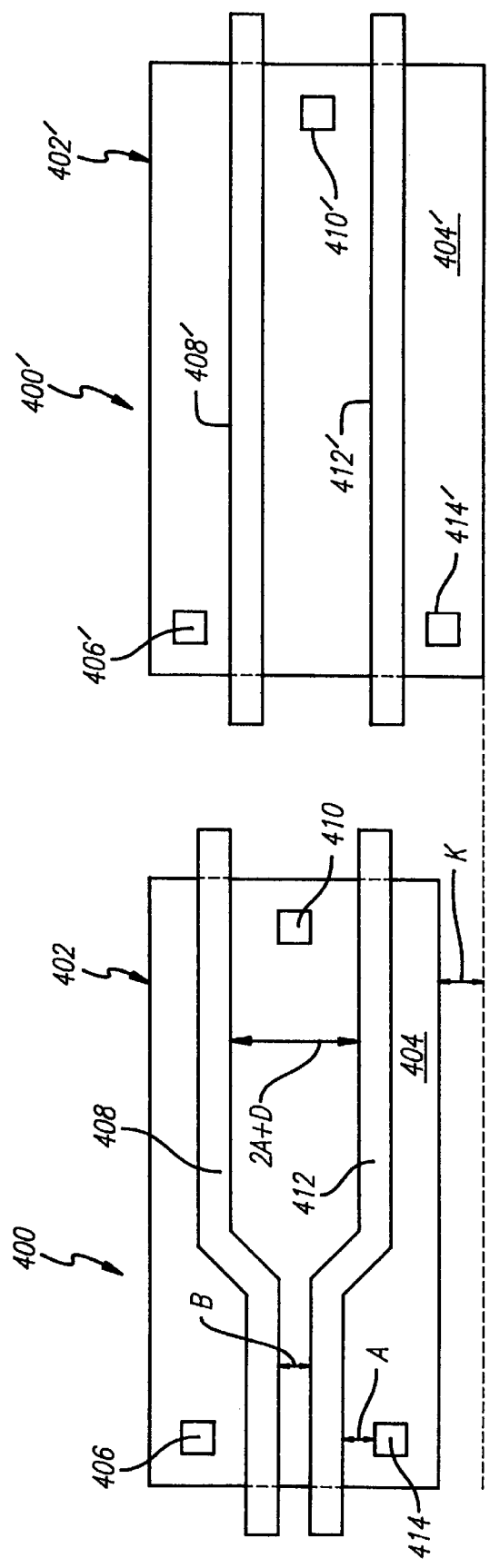
FIG. 14 is a diagram illustrating a microelectronic cell in the form of an ANY element.

FIG. 14 illustrates an cell 400 which is configured as an "ANY" element. The cell 400 comprises a substrate 402, active area 404, contact 406, gate 408 and contact 410 which are essentially similar to the corresponding elements of the cell 300. In addition, the cell 400 comprises an additional gate 412 which is substantially a mirror image of the gate 408, and is symmetrically offset from the gate 408 about the contact 410.

The first sections of the gates 408 and 412 are spaced from each other by the distance B. The second sections of the gates 408 and 412 are spaced from each other by a distance 2A+D. Another contact 414 is spaced from the first section of the gate 408 by the distance A. The cell 400 provides a logical ANY function, in that a high signal applied to ANY (either) gate 408 and/or 412 will turn on the cell 400.

The reduction in height of the cell 400 as compared to a cell 400' having straight gates 408' and 412' is illustrated in FIG. 14. The height of the cell 400 is [2(A+D+E+W)]+B, whereas the height of the cell 400' is [2(A+D+E+W)]+2A+D. The reduction of height K=2[(A+D+E)−C], with the offset of the gate sections being (A+D+E)−C as in the previous embodiments.

Figure 15A:
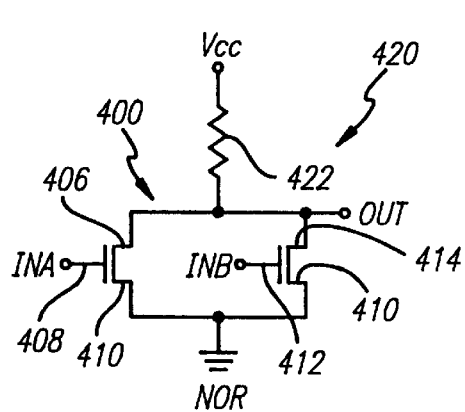
FIGS. 15a to 15d are electrical schematic diagrams illustrating the element of FIG. 14 connected to perform different logical functions.

FIG. 15a illustrates how the cell 400 can be connected to provide a NOR gate 420. The contact 410 is connected to ground, whereas the contacts 406 and 414 are commonly connected to Vcc through a pull-up resistor 422. Inputs signals INA and INB are applied to the gates 408 and 412, and the output signal OUT appears at the common connection of the contacts 406 and 414.

In the NOR gate 420, any (either) high input signal INA or INB will establish a conductive path and turn on the cell 400, causing the output OUT to be pulled low. If both input signals INA and INB are low, the cell 400 will be turned off and the output OUT will be pulled high by the resistor 422.

More specifically, if the input INA is high, the portion of the channel under the gate 408 is enhanced, establishing a conductive path between the contacts 406 and 410. If the input INB is high, the portion of the channel under the gate 412 is enhanced, establishing a conductive path between the contacts 410 and 414.

Figure 15B:
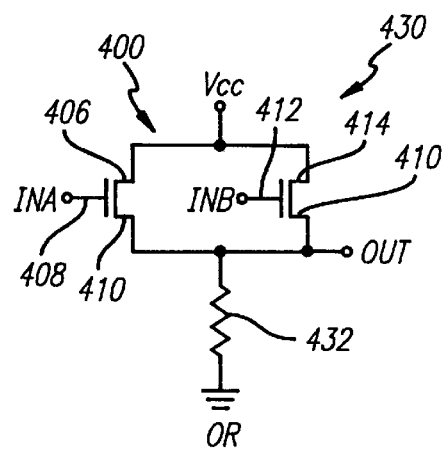

FIG. 15b illustrates the cell 400 as incorporated into an OR gate 430. If any input INA or INB is high, a conductive path is established through the cell 400, and the output OUT is pulled high. If both inputs are low, the cell 400 is turned off, and the output OUT is pulled low by a resistor 432 which is connected between the contact 410 and ground.

Figure 15C:
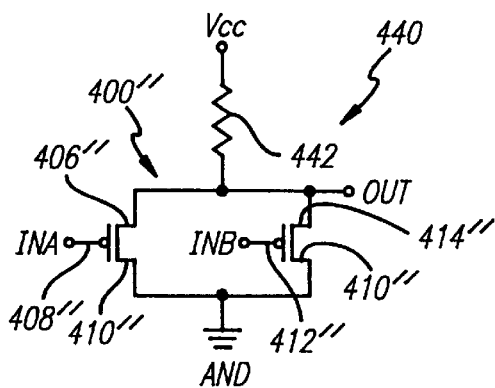

FIG. 15c illustrates how to implement a cell 400' in PMOS to provide an AND gate configuration. If any input is low, a conductive path is established and the output OUT is pulled low. If both inputs are high, the cell 400" is turned off, and the output is pulled high by a pull-up resistor 442 which is connected between the contacts 406 and 414 and Vcc.

Figure 15D:
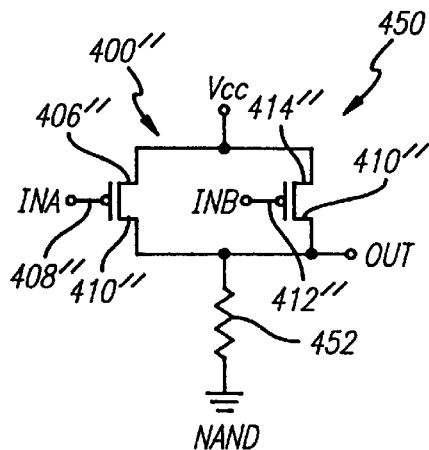

FIG. 15d illustrates a PMOS NAND gate 450 incorporating the cell 400". If any input is low, a conductive path is established and the output is pulled high. If both inputs are high, the cell 400" is turned off, and the output is pulled low by a resistor 452 which is connected between the contact 410 and Vcc.

Although cells comprising one or two gates have been described above with reference to the drawings, the invention is not so limited. The ALL any ANY cells or elements can be modified within the invention to comprise three or any larger number of gates.

Figure 16:
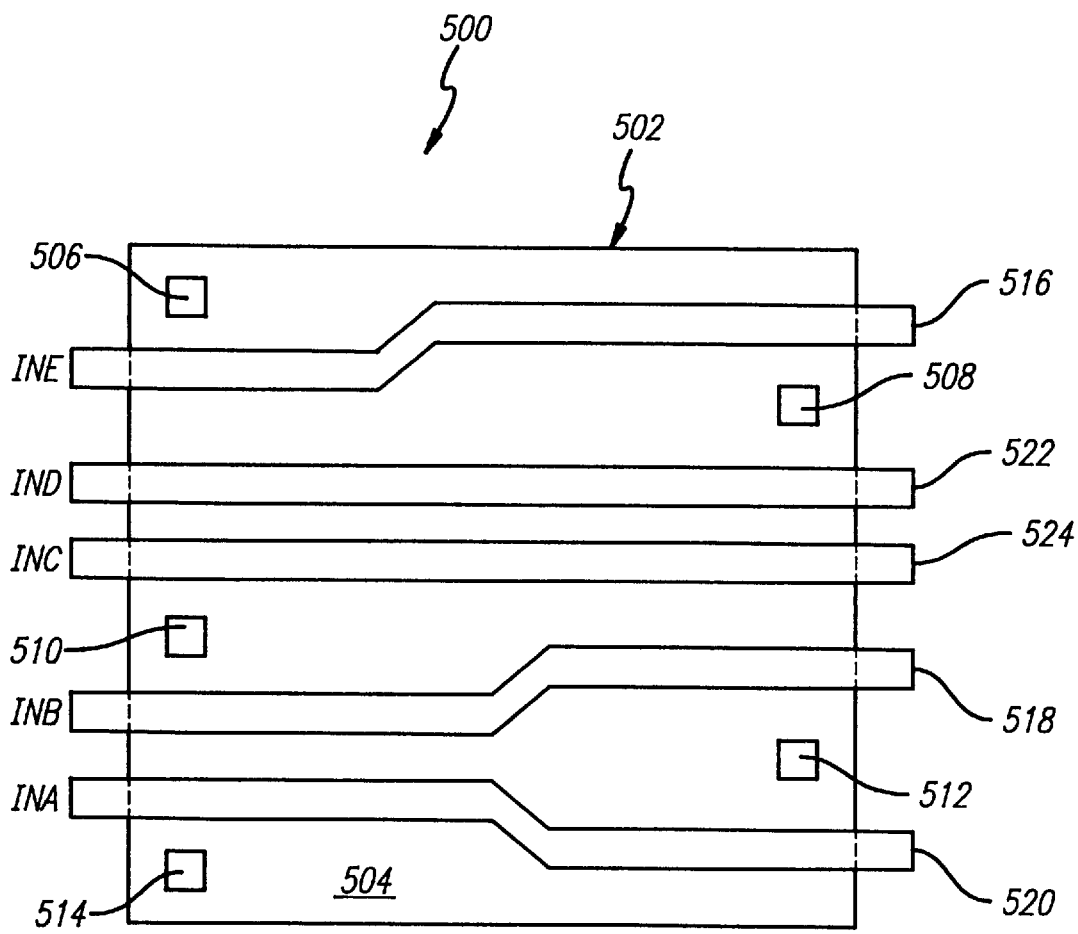
FIG. 16 is a diagram illustrating a microelectronic cell having an exemplary complex logical function.

FIG. 16 illustrates a cell 500 comprising a substrate 502 in which an active area 504 is formed. In addition to bent gates as described above, the cell 500 includes a plurality of straight gates to provide a desired logical functionality. It will be understood that the cell 500 is exemplary only, and that bent gates and straight gates can be provided in a cell embodying the present invention in any desired combination.

The cell 500 comprises contacts 506, 508, 510, 512 and 514, and bent gates 516, 518 and 520 as illustrated. The cell 500 further comprises straight gates 522 and 524 which extend between the contacts 508 and 510.

Figure 17:
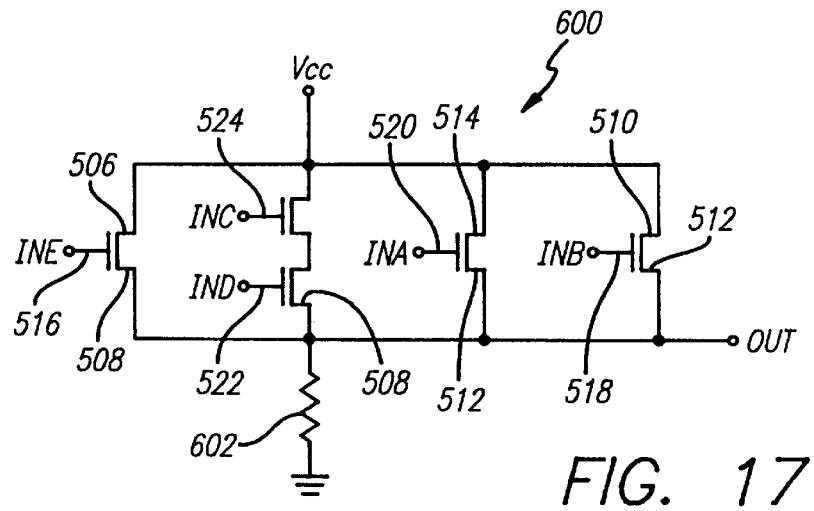
FIG. 17 is an electrical schematic diagram illustrating the logical function of the element of FIG. 16.

FIG. 17 illustrates a logic element 600 which incorporates the cell 500. Inputs INA, INB, INC, IND and INE are illustrated as being applied to the gates 520, 518, 524, 522 and 516 respectively. The terminals 508 and 512 are connected to ground through a pull-down resistor 602, and the terminals 506, 510 and 514 are connected to Vcc. The element 600 provides the logical function INE+(INC•IND) +(INA+INB).

The contacts 506 and 508 in combination with the gate 516 constitute a non-inverting driver or buffer as illustrated in FIG. 11b which produces the logical function INE. The contacts 510, 512 and 514 in combination with the gates 518 and 520 constitute an OR gate as illustrated in FIG. 15b which produces the logical function (INA+INB). The contacts 508 and 510 in combination with the gates 522 and 524 constitute an AND gate which, although the gates 522 and 524 are straight, produce the logical function (INC•IND) as illustrated in FIG. 13b.

It will, of course, be understood that various modifications and additions can be made to the preferred embodiments of the present invention discussed above without departing from the scope or spirit of the present invention. Accordingly, the scope of the present invention should not be limited by the particular embodiments discussed above, but should be defined only by the claims set forth below and equivalents thereof.

Various modifications will become possible for those skilled in the art after receiving the teachings of the present disclosure without departing from the scope thereof.

We claim:

1. A microelectronic ALL element, comprising:
   a first contact which has a width D perpendicular to a reference axis, and is spaced from said reference axis by a minimum spacing E;
   a gate including;
   a first section which extends substantially parallel to said reference axis, the first contact being disposed between the first section and said reference axis, the first section being spaced from the first contact by a minimum spacing A;
   a second section which extends substantially parallel to and is spaced from said reference axis by a minimum spacing C<(A+D+E), the second section being spaced from the first section along said reference axis; and a third section which extends at an angle to said reference axis and joins adjacent ends of the first and second sections;

a second contact, the second section being disposed between the second contact and said reference axis; and a second gate having a shape which is substantially similar to the first gate, the first gate being disposed between the second gate and said reference axis, the second gate being offset from the first gate by a minimum spacing B.

2. A microelectronic ALL element as in claim 1, in which the second contact is spaced from the second section of the second gate by the minimum spacing A.

3. A microelectronic ALL element as in claim 1, in which the second sections of the first and second gates are offset from the first sections thereof toward said reference axis by substantially a distance K=(A+D+E)−C.

4. A microelectronic ALL element as in claim 1, in which said angle is between approximately 30° and 60°.

5. A microelectronic ALL element as in claim 1, in which said angle is approximately 45°.

6. A microelectronic ANY element, comprising:

a first contact which has a width D perpendicular to a reference axis, and is spaced from said reference axis by a minimum spacing E;

a gate including;
 a first section which extends substantially parallel to said reference axis, the first contact being disposed between the first section and said reference axis, the first section being spaced from the first contact by a minimum spacing A;
 a second section which extends substantially parallel to and is spaced from said reference axis by a minimum spacing C<(A+D+E), the second section being spaced from the first section along said reference axis; and
 a third section which extends at an angle to said reference axis and joins adjacent ends of the first and second sections;

a second contact, the second section being disposed between the second contact and said reference axis;

a second gate which is symmetrically offset from the first gate away from said reference axis about the second contact, the second gate having a first section, a second section, and a third section which joins adjacent edges of the first and second sections thereof; and a third contact, the first sections of the first and second gates being disposed between the first and third contacts.

7. A microelectronic ANY element as in claim 6, in which the second contact is spaced from the second section of the first gate by the minimum spacing A.

8. A microelectronic ANY element as in claim 6, in which the second section of the first gate is offset from the first section thereof toward said reference axis by substantially a distance K=(A+D+E)−C.

9. A microelectronic ANY element as in claim 6, in which said angle is between approximately 30° and 60°.

10. A microelectronic ANY element as in claim 6, in which said angle is approximately 45°.

11. A microelectronic cell, comprising:

a semiconductor substrate;

a doped active area formed in the substrate;

a first gate and a second gate formed in the doped active area; and a first contact which is formed in the active area, has a width D perpendicular to a reference axis defined in the doped active area, and is spaced from said reference axis by a minimum spacing E;

the first gate including;
 a first section which extends substantially parallel to said reference axis, the first contact being disposed between the first section and said reference axis, the first section being spaced from the first contact by a minimum spacing A;
 a second section which extends substantially parallel to and is spaced from said reference axis by a minimum spacing C<(A+D+E), the second section being spaced from the first section along said reference axis;
 a third section which extends at an angle to said reference axis and joins adjacent ends of the first and second sections; and the second gate having a shape which is substantially similar to the first gate, the first gate being disposed between the second gate and said reference axis, the second gate being offset from the first gate by a minimum spacing B.

12. A microelectronic cell as in claim 11, in which:

the second gate has a first section, a second section, and a third section which joins adjacent edges of the first and second sections; and the cell further comprises a second contact, the second sections of the first and second gates being disposed between the second contact and said reference axis.

13. A microelectronic cell as in claim 12, in which the second contact is spaced from the second section of the second gate by the minimum spacing A.

14. A microelectronic cell as in claim 11, in which said reference axis substantially coincides with an edge of the doped active area.

15. A microelectronic cell as in claim 11, in which the second section of the first gate is offset from the first section toward said reference axis by substantially a distance K=(A+D+E)−C.

16. A microelectronic cell as in claim 11, in which said angle is between approximately 30° and 60°.

17. A microelectronic cell as in claim 11, in which said angle is approximately 45°.

18. A microelectronic cell, comprising:

a semiconductor substrate;

a doped active area formed in the substrate;

a first gate and a second gate formed in the doped active area; and a first contact which is formed in the active area, has a width D perpendicular to a reference axis defined in the doped active area, and is spaced from said reference axis by a minimum spacing E;

the first gate including;
 a first section which extends substantially parallel to said reference axis, the first contact being disposed between the first section and said reference axis, the first section being spaced from the first contact by a minimum spacing A;
 a second section which extends substantially parallel to and is spaced from said reference axis by a minimum spacing C<(A+D+E), the second section being spaced from the first section along said reference axis;
 a third section which extends at an angle to said reference axis and joins adjacent ends of the first and second sections;

a second contact, the second section being disposed between the second contact and said reference axis; and the second gate which having a shape which is substantially a mirror image of the first gate and is symmetrically offset from the first gate away from said reference axis about the second contact.

19. A microelectronic cell as in claim 18, in which:

the second gate has a first section, a second section, and a third section which joins adjacent edges of the first and second sections; and the cell further comprises a third contact, the first sections of the first and second gates being disposed between the first and third contacts.

20. A microelectronic cell as in claim 19, in which said reference axis substantially coincides with an edge of the doped active area.

21. A microelectronic cell as in claim 19, in which the second section of the first gate is offset from the first section toward said reference axis by substantially a distance $K=(A+D+E)-C$.

22. A microelectronic cell as in claim 19, in which said angle is between approximately 30° and 60°.

23. A microelectronic cell as in claim 19, in which said angle is approximately 45°.

24. A microelectronic cell as in claim 19, in which the third contact is spaced from the first section of the second gate by the minimum spacing A.

25. A microelectronic cell as in claim 19, in which the second contact is spaced from the second sections of the first and second gates by the minimum spacing A.

26. A microelectronic cell as in claim 19, in which the second section of the first gate is spaced from the second section of the second gate by the distance $2A+D$.

* * * * *